US 6,447,217 B1

(12) United States Patent
Toda et al.

(10) Patent No.: US 6,447,217 B1
(45) Date of Patent: Sep. 10, 2002

(54) SUBSTRATE TRANSFER DEVICE AND OPERATING METHOD THEREOF

(75) Inventors: Masayuki Toda, 139 Higashi 2-chome, Yonezawa-shi, Yamagata-ken 992-0026 (JP); Masaki Kusuhara, Tokyo (JP); Masaru Umeda, Tokyo (JP); Michio Yagai, Tokyo (JP)

(73) Assignees: Masayuki Toda, Yamagata-ken (JP); Kabushiki Kaisha Watanabe Shoko, Tokyo (JP)

( * ) Notice: Subject to any disclaimer, the term of this patent is extended or adjusted under 35 U.S.C. 154(b) by 0 days.

(21) Appl. No.: 09/720,764

(22) PCT Filed: Jun. 29, 1999

(86) PCT No.: PCT/JP99/03469

§ 371 (c)(1),
(2), (4) Date: Mar. 26, 2001

(87) PCT Pub. No.: WO00/03428

PCT Pub. Date: Jan. 20, 2000

(30) Foreign Application Priority Data

Jul. 8, 1998 (JP) ............................. 10-193440

(51) Int. Cl.[7] .............................................. B65G 53/16
(52) U.S. Cl. ........................ 406/88; 406/73; 406/112; 406/72; 414/938
(58) Field of Search ................ 406/72, 73, 88, 406/112; 414/937, 938

(56) References Cited

U.S. PATENT DOCUMENTS

| 4,293,249 A | * | 10/1981 | Whelan ..................... 406/72 |
| 4,457,661 A | * | 7/1984 | Flint et al. ................ 414/404 |
| 4,744,715 A | * | 5/1988 | Kawabata ................. 414/331 |
| 4,874,273 A | | 10/1989 | Tokisue et al. |
| 5,842,824 A | * | 12/1998 | Nishi ........................ 414/225 |

FOREIGN PATENT DOCUMENTS

| JP | 53-106580 | 9/1978 | ........... H01L/21/68 |
| JP | 55-99739 | 7/1980 | ........... H01L/21/68 |
| JP | 62-214177 | 9/1987 | ........... C23C/16/44 |
| JP | 63-225028 | 9/1988 | ........... B65G/51/03 |

OTHER PUBLICATIONS

Form PCT/IPEA/409 cover sheet, Box I, Box V, and Box VIII (total of 4 sheets).

* cited by examiner

Primary Examiner—Christopher P. Ellis
Assistant Examiner—Joe Dillon, Jr.
(74) Attorney, Agent, or Firm—Randall J. Knuth

(57) ABSTRACT

A substrate body transfer apparatus, and an operating method therefor, capable of inserting and extracting substrate body into and from a cassette using air conveyance without employing a transfer mechanism such as those in which direct contact is made with the substrate body when inserting or extracting a thin plate-shaped substrate body into or from a cassette. The substrate body transfer apparatus is employed when thin plate-shaped substrate body are extracted from or inserted into cassettes which store the substrate body. The substrate body transfer apparatus includes an air conveyance hand which is provided with a plurality of gas nozzles at the conveyance surface which opposes the rear surface of the substrate body and which has the function of conducting the flotation or grounding of the substrate body, the catching or launch of the substrate body, or the centering of the substrate body; and a cassette platform which has a unitary structure comprising a cassette platform seat on which the cassette is placed and which is provided with a mechanism for horizontally advancing and retracting the cassette with respect to the air conveyance hand, and a mechanism for raising and lowering the cassette platform seat at a predetermined pitch.

10 Claims, 4 Drawing Sheets

SUBSTRATE TRANSFER DEVICE AND OPERATING METHOD THEREOF

BACKGROUND OF THE INVENTION

1. Field of the Invention

The present invention relates to a substrate body transfer apparatus and operating method therefor. In greater detail, the present invention relates to a substrate body transfer apparatus, and an operating method therefor, which is an apparatus employed when extracting or inserting thin plate-shaped substrate bodies employed in the semiconductor industry or the liquid crystal industry or the like from or into cassettes which store the substrate bodies, which is capable of extracting and inserting the substrate bodies while floating the substrate body on a gas.

2. Description of the Related Art

Conventionally, in manufacturing processes of semiconductors and the like, a substrate body conveyance apparatus is employed to move the substrate body (for example, a semiconductor wafer) between manufacturing apparatuses used in each process. Examples of this type of conveyance apparatus are, for example, conveyance apparatuses which convey a cassette jig, into which the substrate body is inserted, on a conveyance vehicle, and conveyance apparatuses which convey the substrate body one at a time using a robot arm. However, in these control apparatuses, the atmosphere in the space in which the substrate body is processed is the atmospheric air, and it is currently the case that such spaces do not have an atmosphere of sufficiently high cleanliness. Recently, methods have also been employed in which a cassette jig with a substrate body inserted thereinto is conveyed in a sealed container; however, the problems of contamination from the materials of the container and the gasket used to maintain air tightness with respect to the substrate body have not been solved.

An air conveyance apparatus which conveys the substrate body using air (an air bearing) within the conveyance path has been proposed as a method for solving these problems. In these air conveyance apparatuses, the conveyance path can be made a closed type (closed system), so that it is possible to make the surroundings of the substrate body a space having a sufficiently high degree of atmospheric cleanliness. In such a conventional air conveyance apparatus, functions such as long or short distance conveyance or divided path conveyance, flotation stoppage by means of hovering, determination of the direction of the axis of crystallization by rotation to the left or right, and the like, are completely provided; however, because this is fundamentally single wafer conveyance, the extraction of single substrate body (for example, semiconductor wafers) stored within a cassette had to be conducted by means of a transfer process wherein direct contact was made with the substrate body, an example of which is a robot hand (finger), or the like.

When the transfer mechanism described above is used, a method in which the rear surface of the substrate body is caused to adhere by vacuum, or a method In which the periphery of the substrate body is supported by a 1-shaped hand from the lower side thereof, have come to be employed. However, in the former case, the contamination of the rear surface of the substrate body becomes a problem, and this cannot be said to be optimal currently, when wafers, both sides of which are mirrored, are employed as the substrate body. Furthermore, in the latter case, there are problems with the chipping of the substrate body or with the attachment of particles which are deposited on parts of the transfer mechanism which support the substrate body.

The present invention has as an object thereof to provide a substrate body transfer apparatus, and an operating method therefor, which is capable of removing substrate bodies from, and inserting them into, cassettes by means of air conveyance, without employing a transfer mechanism such as those which make direct contact with the substrate bodies when extracting thin plate-shaped substrate bodies from, or inserting them into, cassettes; this apparatus is optimal for use as a single wafer processing type air conveyance apparatus.

SUMMARY OF THE INVENTION

The substrate body transfer apparatus in accordance with the present invention is a substrate body transfer apparatus which is employed when thin plate-shaped substrate bodies are extracted from or inserted into cassettes which store the substrate bodies, characterized in comprising: an air conveyance hand which is provided with a plurality of gas nozzles at a conveyance surface which opposes the rear surface of the substrate body and has the function of conducting the flotation or grounding of the substrate body, the catching or launch of the substrate body, or the centering of the substrate body; and a cassette platform which has a unitary structure comprising a cassette platform seat on which the cassette is placed and which is provided with a mechanism for horizontally advancing and retracting the cassette with respect to the air conveyance hand, and a mechanism for raising and lowering the cassette platform seat at a predetermined pitch.

Using the substrate body transfer apparatus described above, the operating method for transferring substrate body from the cassette in the direction of the air conveyance hand is provided with at least: a process for placing the cassette on the cassette platform seat; a process for disposing the air conveyance hand within the cassette by advancing the cassette platform seat in the direction of the air conveyance hand, and bringing the conveyance surface of the air conveyance hand into close proximity with the lower surface of a freely selected substrate body stored within a slot in the cassette; and a process for floating the substrate body by spraying a predetermined gas in the direction of the substrate body from predetermined nozzles provided in the conveyance surface of the air conveyance hand, and moving the substrate body from the cassette in the direction of the air conveyance hand.

Furthermore, using the substrate body transfer apparatus described above, an operating method for transferring substrate body from the air conveyance hand in the direction of the cassette is provided with at least: a process for placing the cassette on the cassette platform seat; a process for advancing the cassette platform seat in the direction of the air conveyance hand which conducts the floatation support of the substrate body, by spraying predetermined gas towards the substrate body from predetermined nozzles provided in the conveyance surface of the air conveyance hand, and accepting the air conveyance hand within a predetermined slot within the cassette; a process for stopping the spraying of the predetermined gas sprayed toward the substrate body from the predetermined nozzles provided in the conveyance surface of the air conveyance hand and inserting the substrate body into a predetermined slot in the cassette; and a process for withdrawing the air conveyance hand from the cassette by retracting the cassette platform seat in the opposite direction from that of the air conveyance hand.

In the substrate body transfer apparatus having the structure described above, the substrate body is supported in a floating state by spraying predetermined gas in the direction of the substrate body from predetermined nozzles provided in the conveyance surface of the air conveyance hand, so that the air conveyance hand, which is the mechanism for moving the substrate body, is capable of inserting the substrate body into and withdrawing the substrate body from the cassette without coming into direct contact with substrate body. Accordingly, a substrate body transfer apparatus is obtained which is capable of eliminating the problems of the contamination of the rear surface of the substrate body, the chipping of the substrate body, or the attachment of particles or the like which are deposited on parts of the transfer apparatus which support the substrate body. Furthermore, in accordance with the operating method described above, it is possible to insert substrate body into and withdraw substrate body from the cassette by using the substrate body transfer apparatus of the present invention.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Description of the References 1 air conveyance hand,
2 cassette platform,
3 mechanism for raising and lowering the cassette platform seat at a predetermined pitch,
4 cassette platform seat,
5 mechanism for horizontally advancing and retracting the cassette with respect to the air conveyance hand,
6 cassette storing substrate body,
7 thin plate-shaped substrate body,
8 slot,
9 flotation nozzles,
10 launching nozzles,
11 another air conveyance apparatus;
12 flange part of air conveyance hand,
13, 14 guides,
15 pipe.
20 rear surface of substrate body
21 substrate bodies
30 conveyance surface of air conveyance hand Hereinbelow, embodiments of the present invention will be explained together with the function of the present invention and the like.

Figure 1:
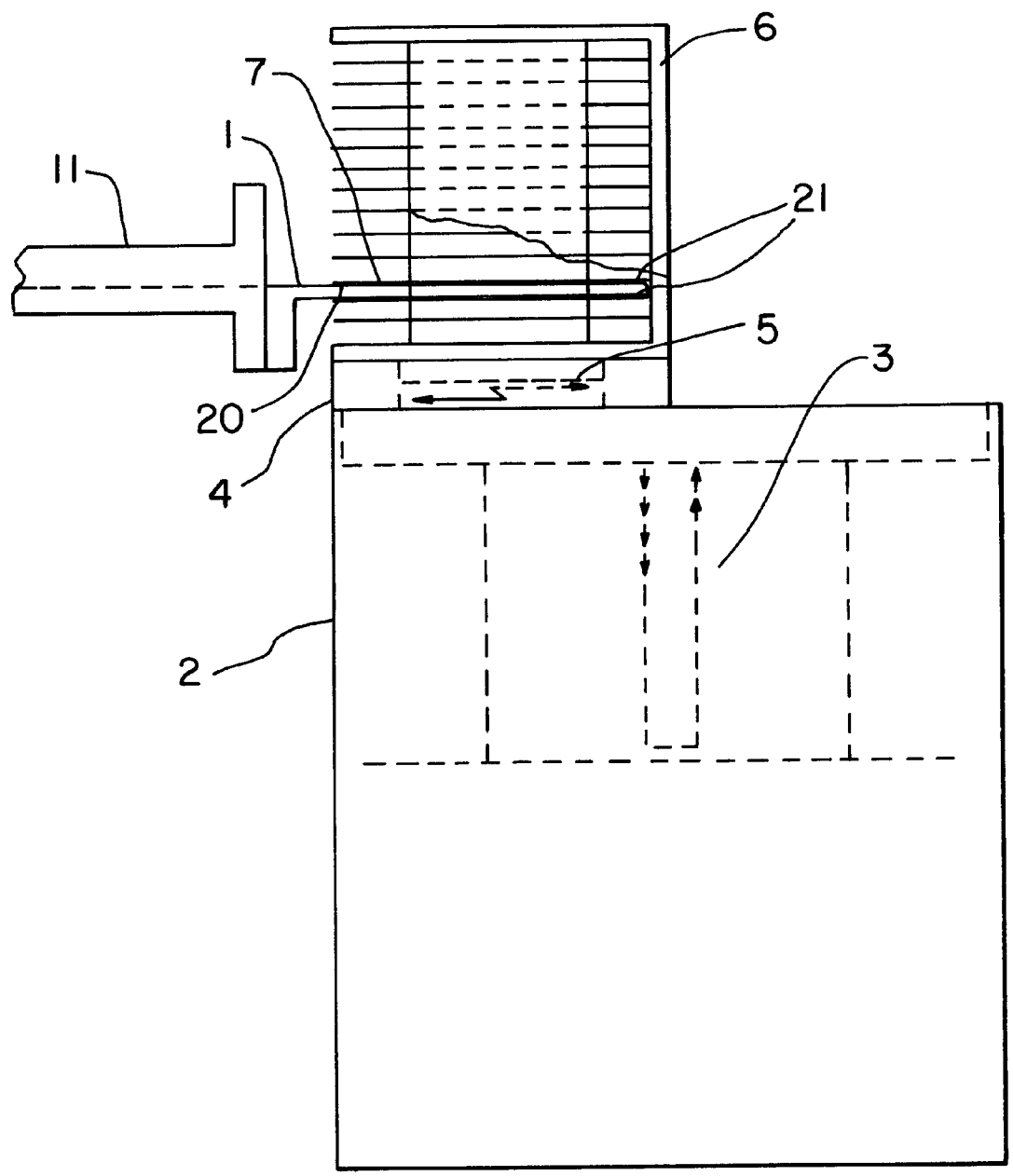
FIG. 1 is a type cross-sectional view showing an example of a substrate body transfer apparatus in accordance with the present invention.
Figure 2:
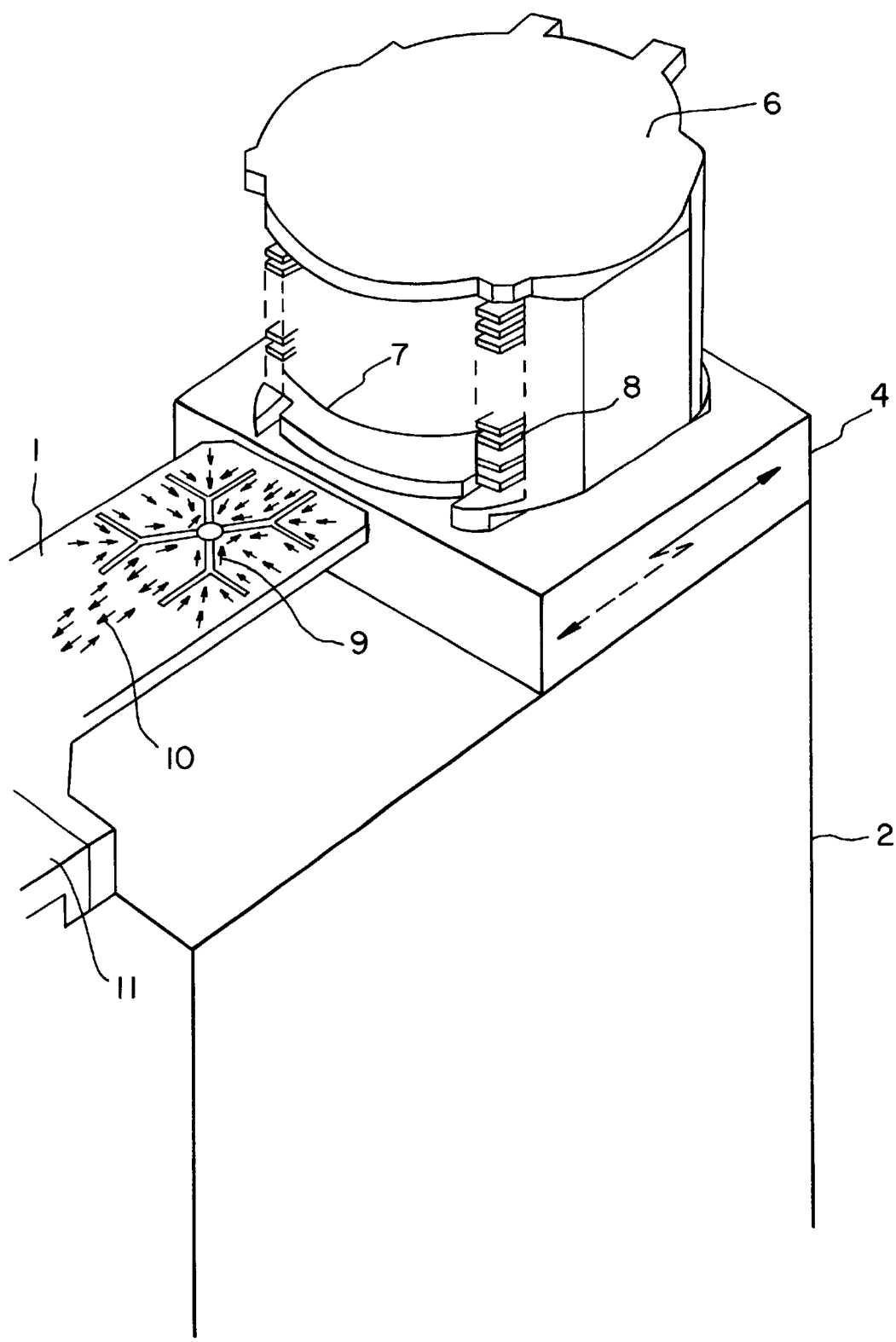
FIG. 2 is a perspective view of the apparatus shown in FIG. 1.
Figure 3A:
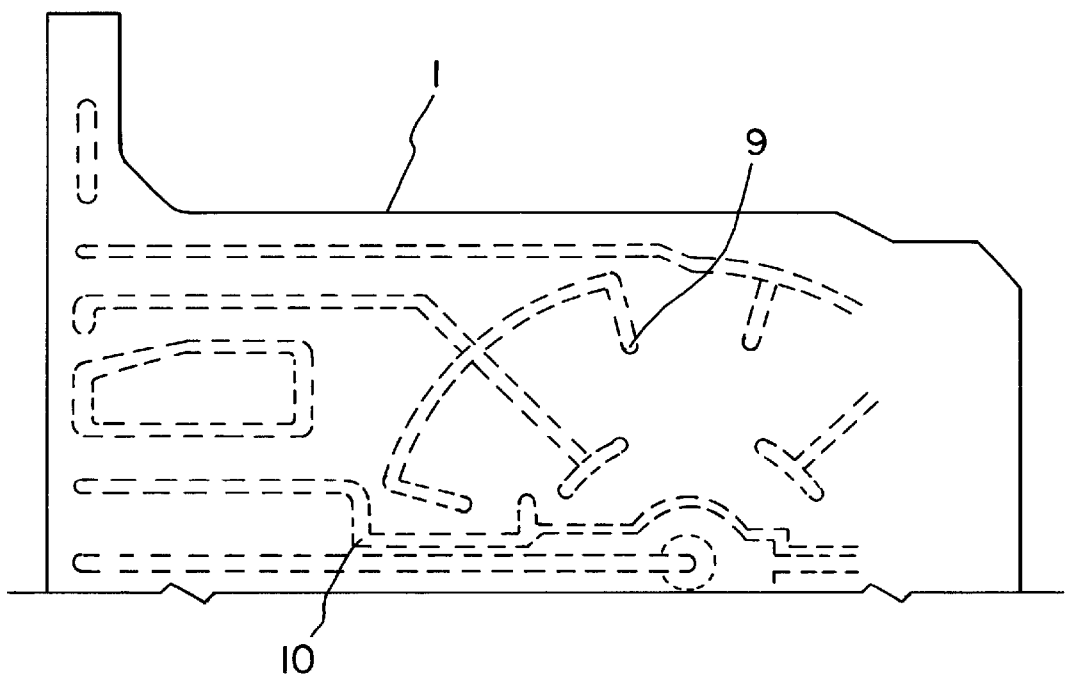
FIG. 3(a) is a top view of the air conveyance hand comprising the apparatus shown in FIG. 1.
Figure 3B:
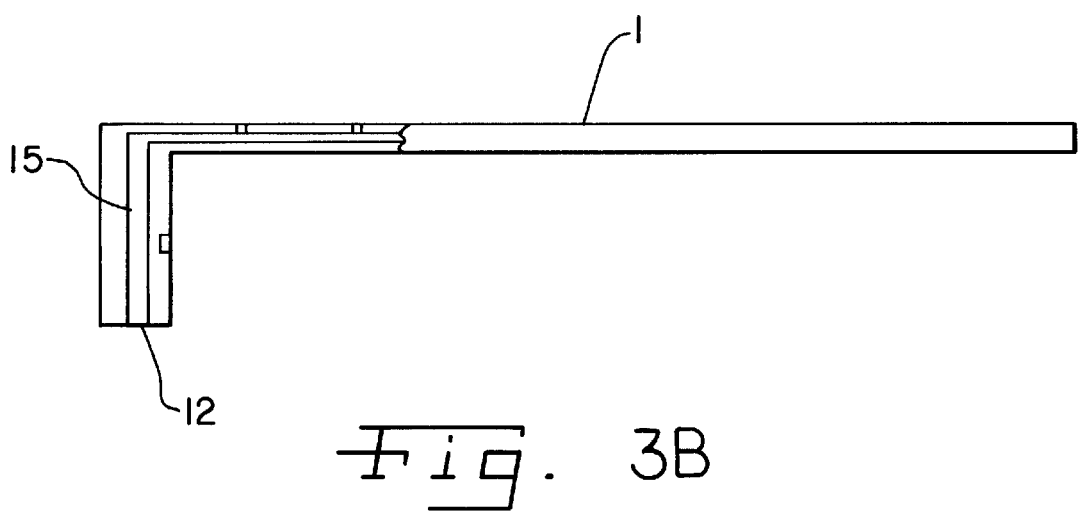
FIG. 3(b) is a cross-sectional view of the air conveyance hand comprising the apparatus shown in FIG. 1.
Figure 4:
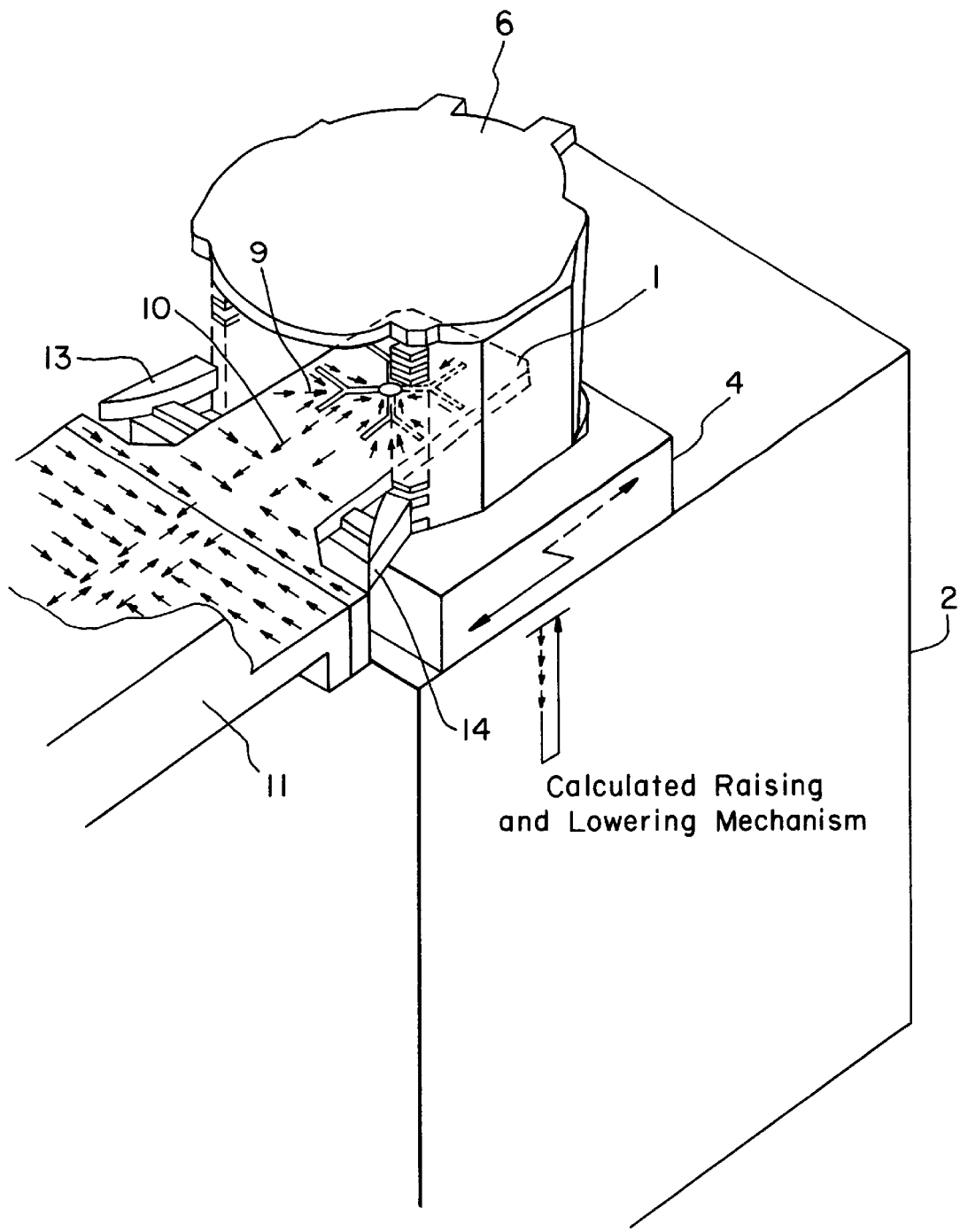
FIG. 4 is a type cross-sectional view showing another example of a substrate body transfer apparatus in accordance with the present invention; this shows the case in which the cassette form seat is provided with guides which are of the same material as the cassette.

FIG. 1 is a type cross-sectional view showing an example of a substrate body transfer apparatus in accordance with the present invention. FIG. 2 is a perspective view of the apparatus shown in FIG. 1. FIG. 3(a) is a top view of an air conveyance hand 1 shown in FIG. 1, while FIG. 3(b) is a cross-sectional view of the air conveyance hand 1 shown in FIG. 1. Furthermore, FIG. 4 is a type cross-sectional view showing another example of a substrate body transfer apparatus in accordance with the present invention.

In FIGS. 1 through 4, 1 indicates an air conveyance hand, 2 indicates a cassette platform, 3 indicates a mechanism for raising and lowing the cassette platform seat at a predetermined pitch, 4 indicates a cassette platform seat, 5 indicates a mechanism for horizontally advancing and retracting the cassette with respect to the air conveyance apparatus, 6 indicates a cassette which stores the substrate body, 7 indicates a thin plate-shaped substrate body having a rear surface 20, 8 indicates a slot, 9 indicates a flotation nozzle, 10 indicates a launching nozzle, 11 indicates another air conveyance apparatus, 12 indicates a flange part of the air conveyance hand, 13 and 14 indicate guides, 15 indicates a pipe, 20 rear surface of a substrate body, 21 substrate bodies, and 30 conveyance surface of air conveyance hand.

As shown in FIG. 1, the substrate body transfer apparatus in accordance with the present invention comprises a cassette platform 2 on which is placed the cassette 6 which stores the substrate body 7, and an air conveyance hand 1, which is a mechanism for transferring the substrate body 7 having a rear surface 20.

Cassette platform 2 is provided with a mechanism 3 (not depicted in the figure) for raising and lowering the cassette platform seat 4 at a predetermined pitch, and a mechanism 5 (not depicted in the figure) for advancing and retracting, with respect to the air conveyance hand 1, the cassette 6 which is placed on the cassette platform seat 4 at the uppermost part thereof, is provided in a unitary manner. Accordingly, by placing the cassette 6 on the cassette platform seat 4, the cassette 6 is advanced and retracted in the direction of the air conveyance hand 1 and in the opposite direction (the direction shown by the arrows), and the cassette 6 may be raised and lowered at a predetermined pitch using the raising and lowering mechanism 3 of the cassette platform 2.

As shown in FIG. 2, a plurality of gas nozzles which have the function of conducting the flotation or grounding of the substrate body, the catching or launching of the substrate body, or the middle extension of the substrate body are provided in the air conveyance hand 1 at the conveyance surface 30 which opposes the rear surface 20 of the substrate body 7. These nozzles have the function of causing the substrate body 7 which is stored in the slot 8 within cassette 6 to float at a height of 0.2 to 0.5 mm as a result of a jetted stream of gas. Here, 9 indicates nozzles for flotation or grounding of the substrate body, while 10 indicates nozzles for the catching or launching of the substrate body. In the figure, the arrows extending from each nozzle indicate the direction in which gas is blown from the nozzles. Furthermore, wafer substrate body, for example, are preferably employed as thin plate-shaped substrate body 7 having a rear surface 20.

A plurality of rows of nozzles 10 for the catching or launching of the substrate body are provided in a parallel manner, and these have the function of applying a propulsive force to the floating substrate body 7 as a result of the horizontal force component of the ejected gas stream. In FIG. 1, the case is shown in which the air conveyance hand 1 is connected to another air conveyance apparatus 11.

As shown in FIG. 3, the supply of gas to each nozzle is conducted via pipes 15 provided in the flange part 12 of the air conveyance hand 1 having a surface 30, and nozzles 9 and 10 are provided with a mechanism (not depicted in the figure) for controlling the spray period of the gas, the flow rate of the gas, and the time schedule of the spraying of the gas for each nozzle.

Hereinbelow, the operating method of the substrate body transfer apparatus in accordance with the present invention will be explained in detail based on FIGS. 1, 2, and 4.

(1) Operating method for moving the substrate body from the cassette in the direction of the air conveyance hand.

First, as shown in FIG. 2, the cassette 6 which stores the substrate body 7 is placed on the cassette platform seat 4 of the cassette platform 2. After it has been determined that the cassette 6 has been placed in a predetermined position by a position detecting mechanism (not depicted in the figure), the platform seat 4 is moved in the horizontal direction, and thus the cassette 6 is advanced in the direction of the air conveyance hand 1. Additionally, when the air conveyance hand 1 is at the position shown in FIG. 4 or FIG. 1 within cassette 6, platform seat 4 is stopped.

Next, gas is sprayed from the flotation nozzles 9 on the air conveyance hand 1 having a surface 30, and platform 2 is lowered at a predetermined pitch, and thereby, the lower surface of the substrate body 7 comes into the vicinity of the upper surface 30 of the air conveyance hand 1 (that is to say, the conveyance surface 30). By means of this operation, the substrate body 7 is caused to float at a height of 0.2 to 0.5 mm within the slot 8 of cassette 6.

Next, substrate body 7 glides in a floating manner above the air conveyance hand 1 from cassette 6 in the direction of the air conveyance hand 1 as a result of the horizontal force component of the gas stream blown from the launching nozzles 10 on the air conveyance hand 1, and is conveyed to another air conveyance apparatus 11.

After the desired substrate body 7 has been conveyed from the cassette 6, the cassette platform 2 is lowered by a predetermined pitch, and thereby, the air conveyance hand 1 is brought into the vicinity of the lower surface of the substrate bodies 20 positioned immediately above wafer 7. Then, by repeating the same operation, a plurality of substrate bodies stored within cassette 6 are conveyed one after the other to the other air conveyance apparatus 11.

After the desired substrate bodies have been conveyed from cassette 6, the cassette platform seat 4 is retracted and placed in the standby state. It is of course the case that, by sending predetermined commands to the apparatus of the present invention, it is possible to raise the cassette platform 2 and to convey a freely determined number of substrate bodies from desired slots within cassette 7.

After this, the cassette platform seat 4 is retracted, and after cassette platform 2 has been set to the predetermined initial height, the empty cassette from which the substrate bodies have been conveyed is unloaded.

(2) Operation method for moving substrate body from the air conveyance hand to the cassette.

First, an empty cassette 6 is placed on the cassette platform seat 4 on cassette platform 2 and the cassette platform seat 4 is advanced in the direction of the air conveyance hand 1. Then, when air conveyance hand 1 has reached the position within cassette 6 shown in FIG. 4 or FIG. 1, the platform seat 4 is stopped.

Next, cassette platform 2 is raised to the predetermined slot position, and gas is sprayed from the flotation nozzles 9 of air conveyance hand 1.

Then, a substrate body which has reached the air conveyance hand 1 from another air conveyance apparatus 11 is advanced by the horizontal force component of a gas stream sprayed by catching (launching) nozzles 10 in air conveyance hand 1 and the speed thereof is progressively reduced, this substrate body enters the empty cassette 6, and is stopped in a hovering state by the gas stream sprayed from the flotation nozzles 9. In this case, as shown in FIG. 4, the cassette platform seat 4 may be provided with guides 13 and 14 made of the same material as the cassette on both sides at the side in which air conveyance hand 1 advances into cassette 6, and thereby, the entrance of the substrate body into the cassette may be facilitated.

Next, by stopping the gas sprayed from the flotation nozzles 9, the substrate body may be placed on the lower shelf (not depicted in the figure) of the slot 8. After this, the cassette platform 2 is slightly raised, and a gap is opened between the lower surface of the substrate body within the slot 8 of cassette 6 and the air conveyance hand 1, and then by horizontally retracting the cassette platform seat 4, the storage of the substrate body in the cassette is completed. Then, by repeating the operation described above, a desired number of substrate body may be stored within cassette 6.

Finally, when the desired number of substrate body to be stored has been reached by repeating the above operations, the air conveyance apparatus 1 is stopped (cycle stop) and placed in a standby state, and the switching of the empty cassette is conducted.

The standard air conveyance apparatus (for example, the apparatus 11 shown in FIG. 1) employs gas of ultra high purity and high cleanliness (where necessary, an inert gas of ultra high purity such as $n_2$ or the like), and employs conveyance in a sealed space having an atmosphere which is sufficiently highly clean. In order to provide for this, the apparatus in accordance with the present invention may be made into a substrate body transfer apparatus in a highly clean atmosphere space by closing all of the apparatus or a portion thereof, evacuating this, and replacing with a highly clean gas.

Furthermore, in the explanation above, an example was shown in which the air conveyance hand 1 was connected to a gas control apparatus 11; however, a load lock chamber or the like may be provided between the air conveyance hand 1 and another air conveyance apparatus 11, and an exchange of atmosphere may be conducted.

Furthermore, in the explanation above, an example was shown in which the cassette 6 was moved relative to the air conveyance hand 1; however, it is of course the case that a structure may be employed in which the air conveyance hand 1 is moved relative to the cassette 6.

As described above, in accordance with the present invention, by conducting the extraction of a substrate body from the cassette or the insertion of the substrate body into the cassette using a air conveyance hand, conveyance becomes possible in which neither the front or rear surfaces of the substrate body are contacted, so that it is possible to dramatically reduce the contamination, chipping, or deposition of particles onto the substrate body.

Furthermore, the extraction of the substrate body from the cassette, or the insertion of the substrate body into the cassette, may be conducted using the air conveyance hand, so that it is possible to easily directly connect, with the cassette which stores the substrate body, an air conveyance apparatus or other thin plate-shaped substrate body processing apparatuses to which air flotation is applied.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A substrate body transfer apparatus which is employed when thin plate-shaped substrate bodies are extracted from or inserted into cassettes which store said substrate bodies, characterized in comprising:

an air conveyance hand which is provided with a plurality of gas nozzles at a conveyance surface which opposes the rear surface of said substrate body and which has the function of conducting the flotation or grounding of said substrate body, the catching or launch of the substrate body, or the centering of the substrate body; and a cassette platform which has a unitary structure comprising a cassette platform seat on which said cassette is placed and which is provided with a mechanism for horizontally advancing and retracting said cassette with respect to said air conveyance hand, and a mechanism for raising and lowering said cassette platform seat at a predetermined pitch.

2. A substrate body transfer apparatus in accordance with claim 1 further comprising:

a means for placing said cassette on said cassette platform seat;

a means for disposing said air conveyance hand within said cassette by advancing said cassette platform seat in the direction of said air conveyance hand, and bringing said conveyance surface of said air conveyance hand into close proximity with the lower surface of a freely selected substrate body stored within a slot in said cassette; and a means for floating said substrate body by spraying a predetermined gas in the direction of said substrate body from predetermined nozzles provided in said conveyance surface of said air conveyance hand, and moving said substrate body from said cassette in the direction of said air conveyance hand.

3. A substrate body transfer apparatus in accordance with claim 1 further comprising:

a means for placing said cassette on said cassette platform seat;

a means for advancing said cassette platform seat in the direction of said air conveyance hand which conducts the floatation support of said substrate body, by spraying predetermined gas towards said substrate body from predetermined nozzles provided in said conveyance surface of said air conveyance hand, and accepting said air conveyance hand within a predetermined slot within said cassette;

a means for stopping the spraying of said predetermined gas sprayed toward said substrate body from said predetermined nozzles provided in said conveyance surface of said air conveyance hand and inserting said substrate body into a predetermined slot in said cassette; and a means for withdrawing said air conveyance hand from the cassette by retracting said cassette platform seat in the opposite direction from that of said air conveyance hand.

4. A substrate body transfer apparatus in accordance with claim 1 further comprising:

a plurality of gas nozzles provided with the function of conducting flotation or grounding of said substrate body provided in the conveyance surface of said air conveyance hand are bored with a predetermined angle with respect to said conveyance surface, a direction of inclination of said angle points to the center of the conveyance surface of said air conveyance hand, and groups of nozzles divided into three or more quadrants are formed in said conveyance surface.

5. A substrate body transfer apparatus in accordance with claim 1 further comprising:

a plurality of gas nozzles provided with the function of conducting medium extraction of said substrate body provided in the conveyance surface of said air conveyance hand are bored with a predetermined angle with respect to said conveyance surface, and the direction of inclination of said angle points to the center of the conveyance surface of said air conveyance hand, and said nozzles are arranged in a plurality of rows positioned corresponding to the outer periphery of said substrate body.

6. A substrate body transfer apparatus in accordance with claim 1 further comprising:

the gas nozzles provided with the function of conducting the catching or launching of said substrate body which are provided in the conveyance surface of said air conveyance hand are bored with a predetermined angle with respect to said conveyance surface, and the direction of inclination of said angle is of two types, one arranged in straight lines in a direction from said cassette to said air conveyance hand, and the other arranged in straight lines in a direction from said air conveyance hand to said cassette, and each straight line arrangement is formed by a plurality of two or more rows.

7. A substrate body transfer apparatus in accordance with claim 1 further comprising:

the external dimensions of said air conveyance hand are dimensions which permit insertion without contact below a desired substrate body disposed in a slot within said cassette.

8. A substrate body transfer apparatus in accordance with claim 1 further comprising:

said cassette platform seat is provided with guides of the same material as said cassette on both sides at the side at which said air conveyance hand is inserted into said cassette.

9. A substrate body transfer apparatus in accordance with claim 1 further comprising:

the plurality of gas nozzles on the conveyance surface of said air conveyance hand are provided with a means for controlling gas spray time, gas flow rate, and time schedule of the spraying of the gas in each nozzle.

10. A substrate body transfer apparatus in accordance with claim 1 further comprising:

said air conveyance hand contains pipes which supply predetermined gas to the plurality of gas nozzles provided in the conveyance surface of said air conveyance hand.

* * * * *